United States Patent
Huang et al.

(10) Patent No.: US 7,605,613 B2
(45) Date of Patent: Oct. 20, 2009

(54) BULK INPUT CURRENT SWITCH LOGIC CIRCUIT

(75) Inventors: Hong-Yi Huang, Taipei (TW); Chun-Tsai Hung, Changhua County (TW); Yuan-Hua Chu, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/141,111

(22) Filed: Jun. 18, 2008

(65) Prior Publication Data

US 2009/0212821 A1      Aug. 27, 2009

(30) Foreign Application Priority Data

Feb. 27, 2008   (TW) ............... 97106922 A

(51) Int. Cl.
*H03K 19/094* (2006.01)
(52) U.S. Cl. .................................... 326/115
(58) Field of Classification Search ............. 326/115
See application file for complete search history.

(56) References Cited

U.S. PATENT DOCUMENTS 6,754,121 B2 * 6/2004 Worley ...................... 365/207

2004/0070423 A1 * 4/2004 Choe ........................... 326/83

OTHER PUBLICATIONS

Article titled " Differential Current Switch Logic: A Low Power DCVS Logic Family" authored by Somasekhar et al., IEEE Journal Solid-State Circuits, vol. 31, No. 7, July 1996 pp. 981-991.
Article titled "Custom and Semi-Custom Design Techniques " authored by Heller et al., ISSCC 84 / Wednesday, Feb. 22, 1984 / Continental Ballrooms 1-4 / 10:00 A.M. pp. 16-17.
Article titled "A Comparison of CMOS Circuit Techniques: Differential Cascode Voltage Switch Logic Versus Conventional Logic" authored by Chu et al., IEEE Journal of Solid-Stage Circuits, vol. SC-22, No. 4, August 1987 pp. 528-532.
Article titled "Design Procedures for Differential Cascode Voltage Swith Circuits "authored by Chu et al., IEEE Journal of Solid-State Circuits, vol. SC-21, No. 6, Dec. 1986 pp. 1082-1087.

* cited by examiner

*Primary Examiner*—James H. Cho
*Assistant Examiner*—Thienvu V Tran
(74) *Attorney, Agent, or Firm*—Jianq Chyun IP Office

(57) ABSTRACT

A current switch logic circuit is disclosed. The circuit includes a current sense amplifier formed by a first transistor to a fifth transistor, and a logic tree. The logic tree is used to generate a first current and a second current. The current sense amplifier generates a first output signal and a second output signal according to the first current and the second current.

15 Claims, 20 Drawing Sheets

BULK INPUT CURRENT SWITCH LOGIC CIRCUIT

CROSS-REFERENCE TO RELATED APPLICATION

This application claims the priority benefit of Taiwan application serial no. 97106922, filed on Feb. 27, 2008. The entirety of the above-mentioned patent application is hereby incorporated by reference herein and made a part of this specification.

BACKGROUND OF THE INVENTION

1. Field of the Invention

The present invention relates to a logic circuit structure. More particularly, the present invention relates to a bulk input current switch logic circuit.

2. Description of Related Art

As functions of electronic products trend to be more complicated, digital logic circuits become favourite choices for designers. Moreover, with quick development of process capability, nanometer process is implemented. In this case, processing technique originally bottlenecked development of digital circuits is now no longer the biggest problem, instead, it is the transmission speed of a conventional logic gate circuit that limits a whole circuit performance thereof.

FIG. 1 is a circuit diagram illustrating a 3-input NOR gate circuit of a conventional static logic circuit. For such conventional logic gate circuit, if input terminals A~C are all level "0", three P-type transistors are then turned on, so that an output $V_O$ has a high level "1". If at least one of the input terminals A~C has the high level "1", at least one of the N-type transistors is then turned on, so that the output $V_O$ has a low level "0". Since such logic circuit requires a set of serially connected P-type transistors (or N-type transistors), the more the input terminals are, during one output transition, the more the transistors required to be turned on.

FIG. 2 is a circuit diagram illustrating a 2-input NAND gate circuit of a conventional dynamic logic circuit. Such conventional dynamic logic circuit requires a pre-charge enable signal $\phi$. Wherein, when the pre-charge enable signal $\phi$ has the low level "0", the output $V_O$ may be pre-charged to the high level "1". When the pre-charge enable signal $\phi$ is transited to the high level "1", the output $V_O$ is then determined according to levels of the input B and input C. If the input B and the input C are all the high level "1", the output $V_O$ is then lowered to the level "0" due to turning on of the transistor. Conversely, if at least one of the input B and the input C is not the high level "1", the output $V_O$ is then maintained to be the high level "1".

Next, referring to FIGS. 3A and 3B, FIG. 3A is a circuit diagram illustrating a conventional N-type transistor differential logic circuit. FIG. 5B is an sample diagram of a logic unit 310 of FIG. 3A. Such conventional logic circuit may implement a differential input via input A, input B or input C, and inverted signal input $\overline{A}$, input $\overline{B}$ or input $\overline{C}$. In coordination with a conventional technique of the dynamic logic circuit, a pre-charge time is controlled via the pre-charge enable signal $\phi$. Moreover, the conventional logic circuit may further include a latch circuit (in coordination with a transistor MP1 of an output Q, or a transistor MP2 of an output $\overline{Q}$) for further stabilizing the output of the circuit. However, the differential logic circuit also requires a set of serially connected transistor in case of multiple inputs.

FIG. 4 is a circuit diagram illustrating a conventional bulk input differential logic circuit. Referring to FIG. 4, via a current sense amplifier composed of transistors M2, M3, M5 and M7, such conventional logic circuit may sense a current $I_L$ generated by transistors $M_{41}$~$M_{4n}$ connected in parallel, and sense a current $I_R$ generated by transistors $M_{81}$~$M_{8n}$ connected in parallel, and meanwhile generate the output Q and the output $\overline{Q}$ according to the sensing results. The pre-charge enable signal $\phi$ and the transistors M1 and M6 respectively provide a pre-charge signal and a pre-charge path. The transistor M9 provides a ground voltage during a non pre-charge period. Regardless of the number of input terminals, such conventional logic circuit only has 3 serially connected N-type transistors, and therefore a response speed of the circuit may be effectively improved.

SUMMARY OF THE INVENTION

Accordingly, the present invention is directed to a bulk input current switch logic circuit for providing a high speed and low power logic circuit in case of multiple logic input signals.

The present invention provides a bulk input current switch logic circuit including a current sense amplifier and a logic tree. The current sense amplifier includes a first transistor to a fifth transistor. A first source/drain of the first transistor is coupled to a first voltage, a gate thereof is coupled to a pre-charge enable signal. A first source/drain of the second transistor is coupled to a second source/drain of the first transistor, a gate thereof is coupled to a first output terminal, and a second source/drain thereof is coupled to a second output terminal. A first source/drain of the third transistor is coupled to the second source/drain of the first transistor, a gate thereof is coupled to the second output terminal, and a second source/drain thereof is coupled to the first output terminal. A first source/drain of the fourth transistor is coupled to the second output terminal, and a gate thereof is coupled to the first output terminal. Moreover, a first source/drain of the fifth transistor is coupled to the first output terminal, and a gate thereof is coupled to the second output terminal.

Moreover, the logic tree is coupled to the current sense amplifier for generating a first current according to a first input signal and a second input signal, and generating a second current according to a third input signal and a fourth input signal.

In the present invention, based on bulk inputting and in coordination with the current latch sense amplifier, all the devices may be connected in parallel to generate complementary outputs and avoid direct current power consumption. Moreover, response speed of the current latch sense amplifier is quite high. Therefore, power consumption thereof may be effectively decreased, and working speed may be effectively improved.

In order to make the aforementioned embodiment accompanied with figures is described in detail below.

DESCRIPTION OF EMBODIMENTS

Figure 1:
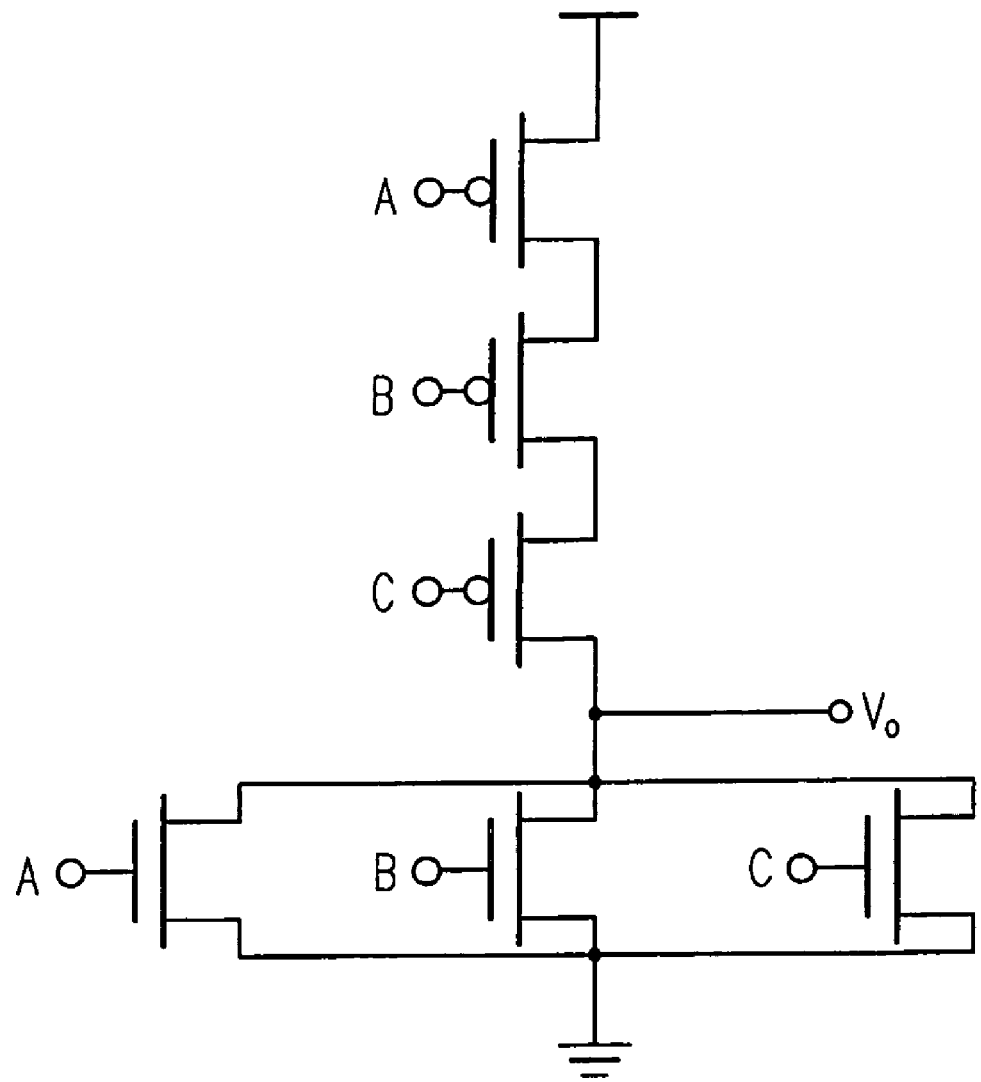
FIG. 1 is a circuit diagram illustrating a 3-input NOR gate circuit of a conventional static logic circuit.
Figure 2:
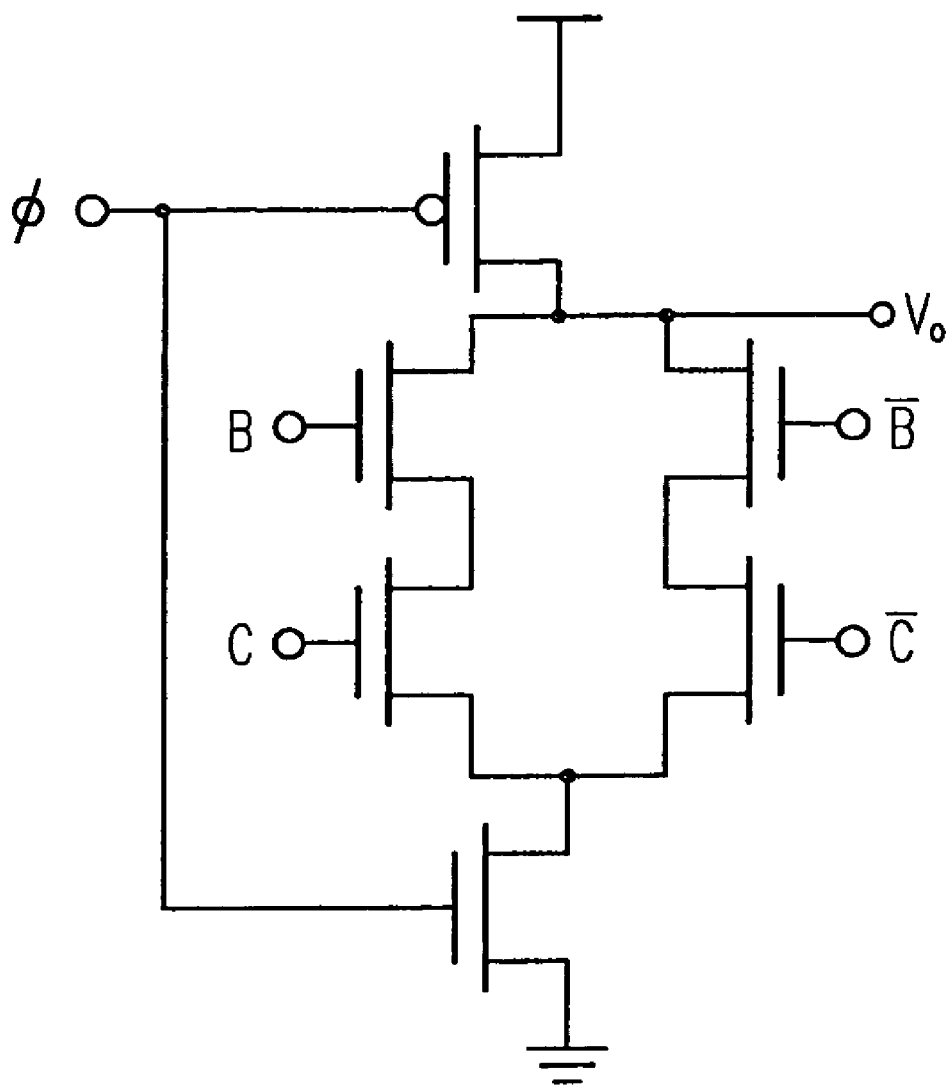
FIG. 2 is a circuit diagram illustrating a 2-input NAND gate circuit of a conventional dynamic logic circuit.
Figure 3A:
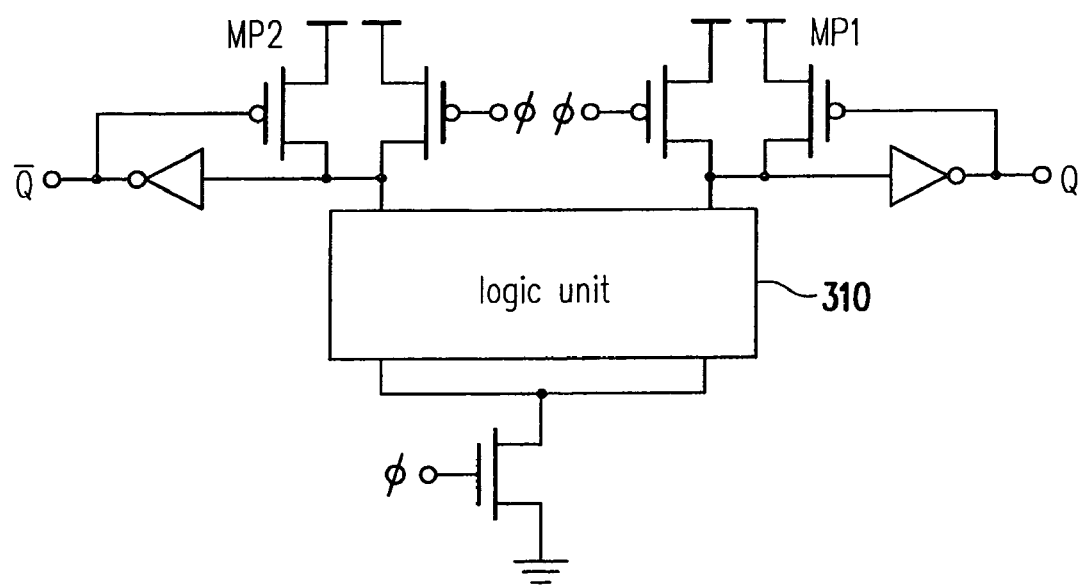
FIG. 3A is a circuit diagram illustrating a conventional N-type transistor differential logic circuit.
Figure 3B:
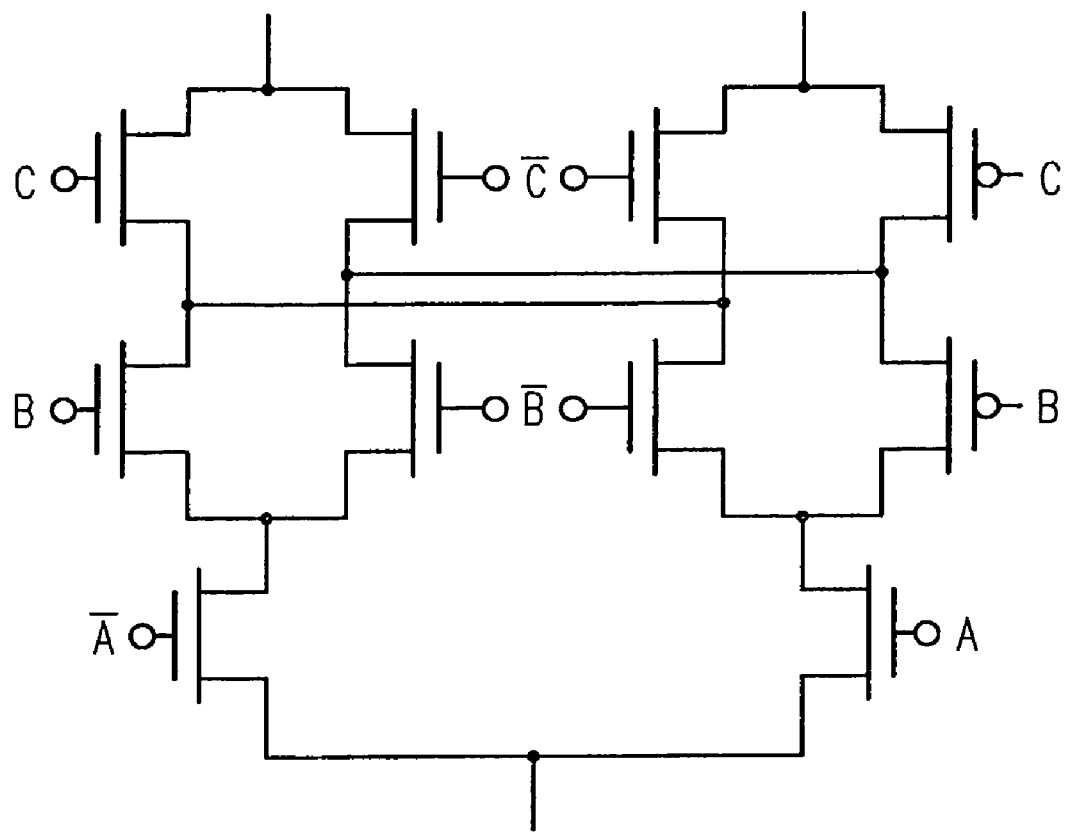
FIG. 3B is an sample diagram of a logic unit of FIG. 3A.
Figure 4:
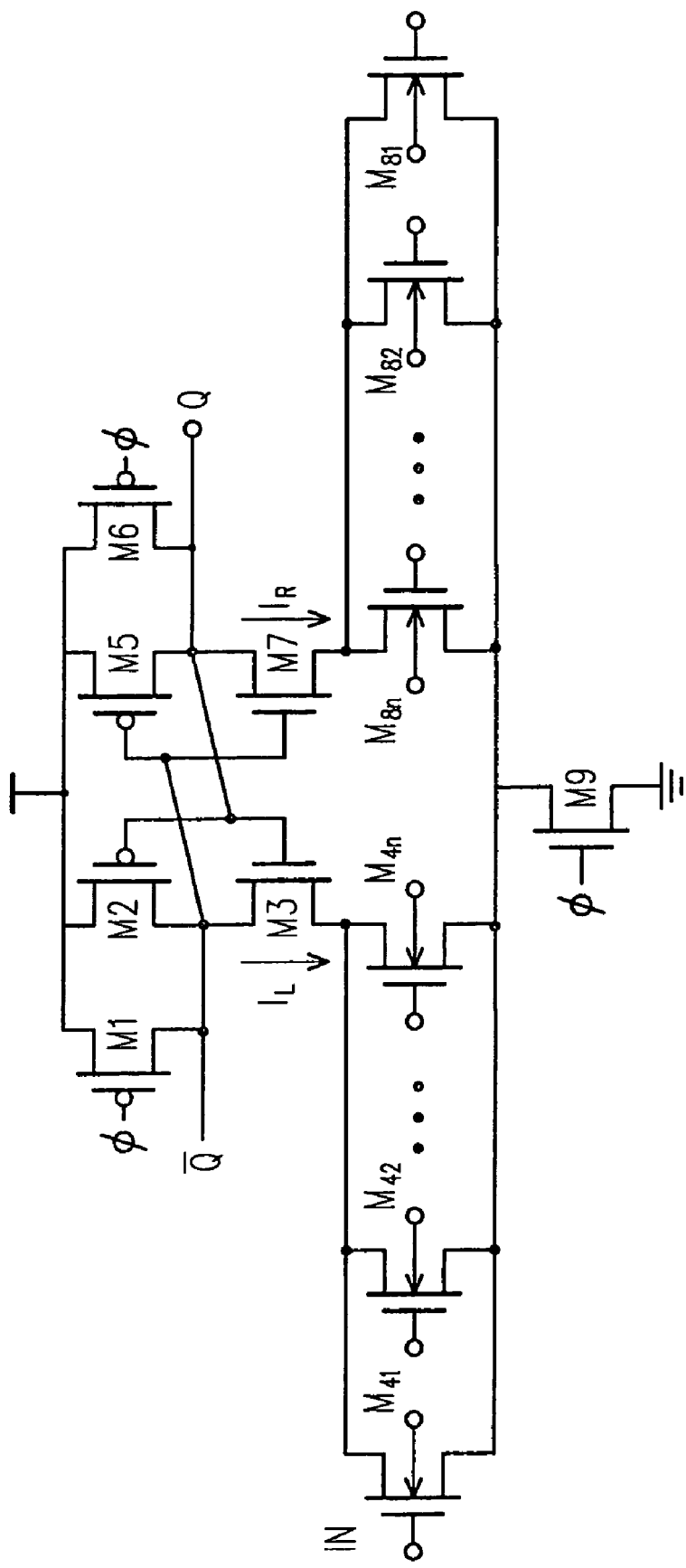
FIG. 4 is a circuit diagram illustrating a conventional bulk input differential logic circuit.
Figure 5:
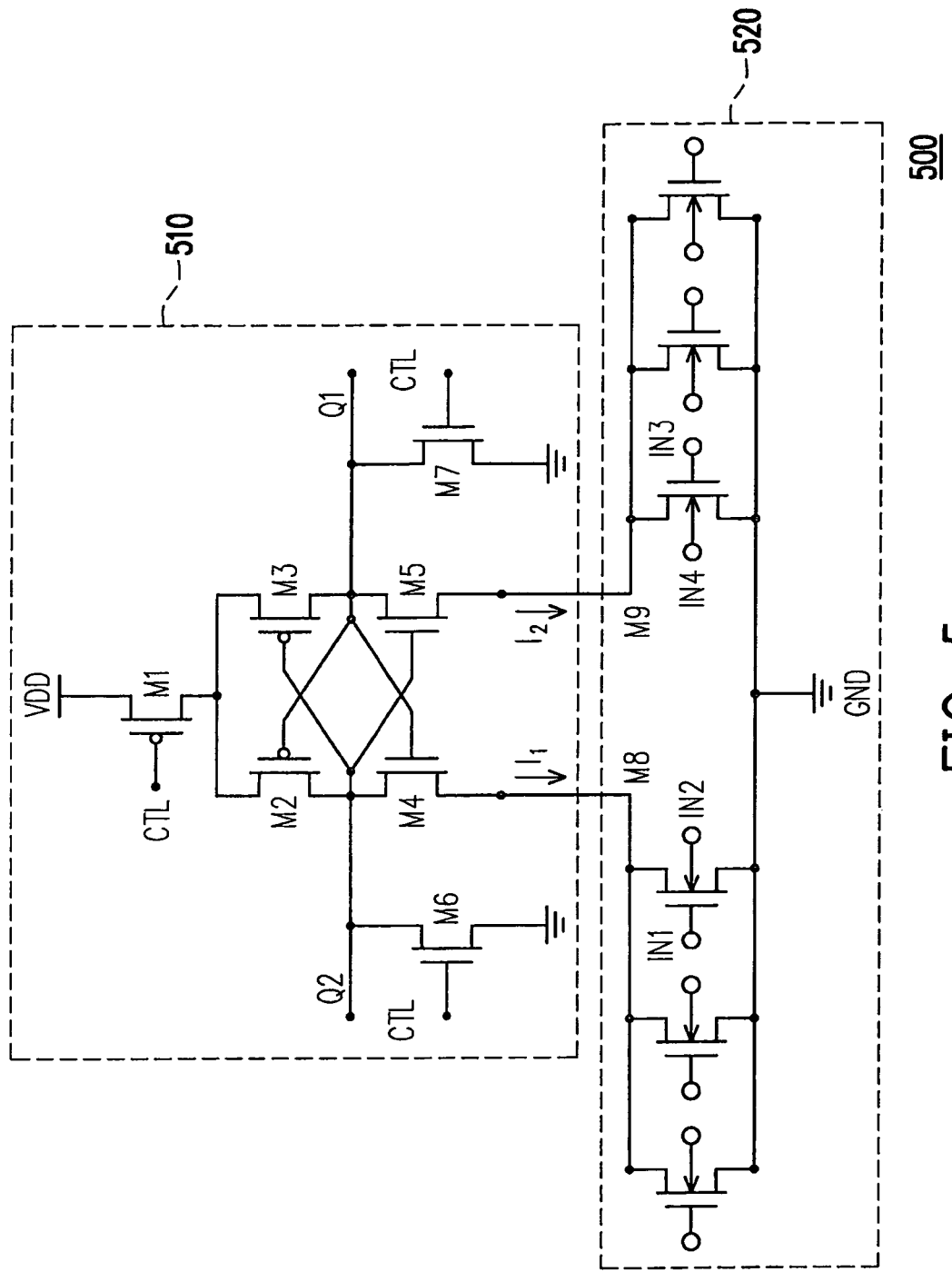
FIG. 5 is a circuit diagram illustrating an N-type bulk input current switch logic circuit according to an embodiment of the present invention.

First, referring to FIG. 5, a circuit diagram illustrating an N-type bulk input current switch logic circuit according to an embodiment of the present invention is shown. The bulk input current switch logic circuit 500 includes a current sense amplifier 510 and a logic tree 520. The current sense amplifier 510 includes transistors M1~M7, and the logic tree 520 includes at least one transistor M8 and at least one transistor M9. Wherein, a gate of the transistor M1 is coupled to a pre-charge enable signal CTL, and a first source/drain thereof is coupled to a system voltage VDD. A second source/drain of the transistor M1, a first source/drain of the transistor M2 and a first source/drain of the transistor M3 are coupled to each other. A gate of the transistor M2 and a gate of the transistor M3 are respectively coupled to an output terminal Q1 and an output terminal Q2. Moreover, a second source/drain of the transistor M2, the output terminal Q2 and a first source/drain of the transistor M4 are coupled to each other. A gate of the transistor M4 is coupled to the output Q1. Similarly, a second source/drain of the transistor M3, the output terminal Q1 and a first source/drain of the transistor M5 are coupled to each other, and a gate of the transistor M5 is coupled to the output terminal Q2.

Gates of the transistors M6 and M7 are also coupled to the pre-charge enable signal CTL, and second sources/drains of the transistors M6 and M7 are coupled to a ground voltage GND. A difference is that a first source/drain of the transistor M6 is coupled to the output terminal Q2, and a first source/drain of the transistor M7 is coupled to the output terminal Q1. A first source/drain of the transistor M8 is coupled to the second source/drain of the transistor M4, and a second source/drain of the transistor M8 is coupled to the ground voltage GND. A first source/drain of the transistor M9 is coupled to the second source/drain of the transistor M5, and a second source/drain of the transistor M9 is coupled to the ground voltage GND. When a number of the transistor M9 or the transistor M8 exceeds one, the transistors M8 (or the transistors M9) are connected in parallel to form the logic tree 520. Bulks and gates of the transistors M8 (or the transistors M9) are respectively receive an input signal IN2 and an input signal IN1 (an input signal IN4 and an input signal IN3).

It should be noted that in the present embodiment, besides the transistors M1~M3 are P-type metal-oxide-semiconductors (MOSs), the other transistors are all N-type MOSs. Moreover, regardless of the number of the input signals, only two serially connected N-type MOSs (which are the transistors M4 and M8 or the transistors M5 and M9 in the present embodiment) are applied.

In the present embodiment, operation method of the circuit may be described as follows. When the pre-charge enable signal CTL is enabled (which is level "1" in the present embodiment), levels of the output terminals Q1 and Q2 are lowered to the ground voltage GND, i.e. level "0" due to turning on of the transistors M7 and M6. Next, the pre-charge enable signal CTL is transited to be disable (which is transited to be the level "0" in the present embodiment). Now, the system voltage VDD is transmitted to the circuit via the turned on transistor M1. Meanwhile, the transistors M7 and M6 are turned off. On the other hand, the gate of the transistor M8 receives the input signal IN1, and the bulk thereof receives the input signal IN2. Since the transistor M8 is the N-type MOS, the input signal IN2 has to be less than or equal to the input signal IN1, otherwise a current leakage path may be generated. Moreover, the transistor M8 may provide a current channel, and a current I1 may be generated due to a voltage difference of the input signals IN1 and IN2. Correspondingly, the gate of a transistor M9 receives the input signal IN3, and the bulk thereof receives the input signal IN4. Since the transistor M9 is the N-type MOS, the input signal IN4 has to be less than or equal to the input signal IN3, otherwise the current leakage path may be generated. Moreover, the transistor M9 may provide the current channel, and a current I2 may be generated due to a voltage difference of the input signals IN3 and IN4.

In addition, the current sense amplifier 510 is used for comparing the current I1 to the current I2. If the current I1 is greater than the current I2, the output terminal Q2 outputs the level "0", and the output terminal Q1 outputs the level "1". Conversely, if the current I2 is greater than the current I1, the output terminal Q2 outputs the level "1", and the output terminal Q1 outputs the level "0".

Figure 6:
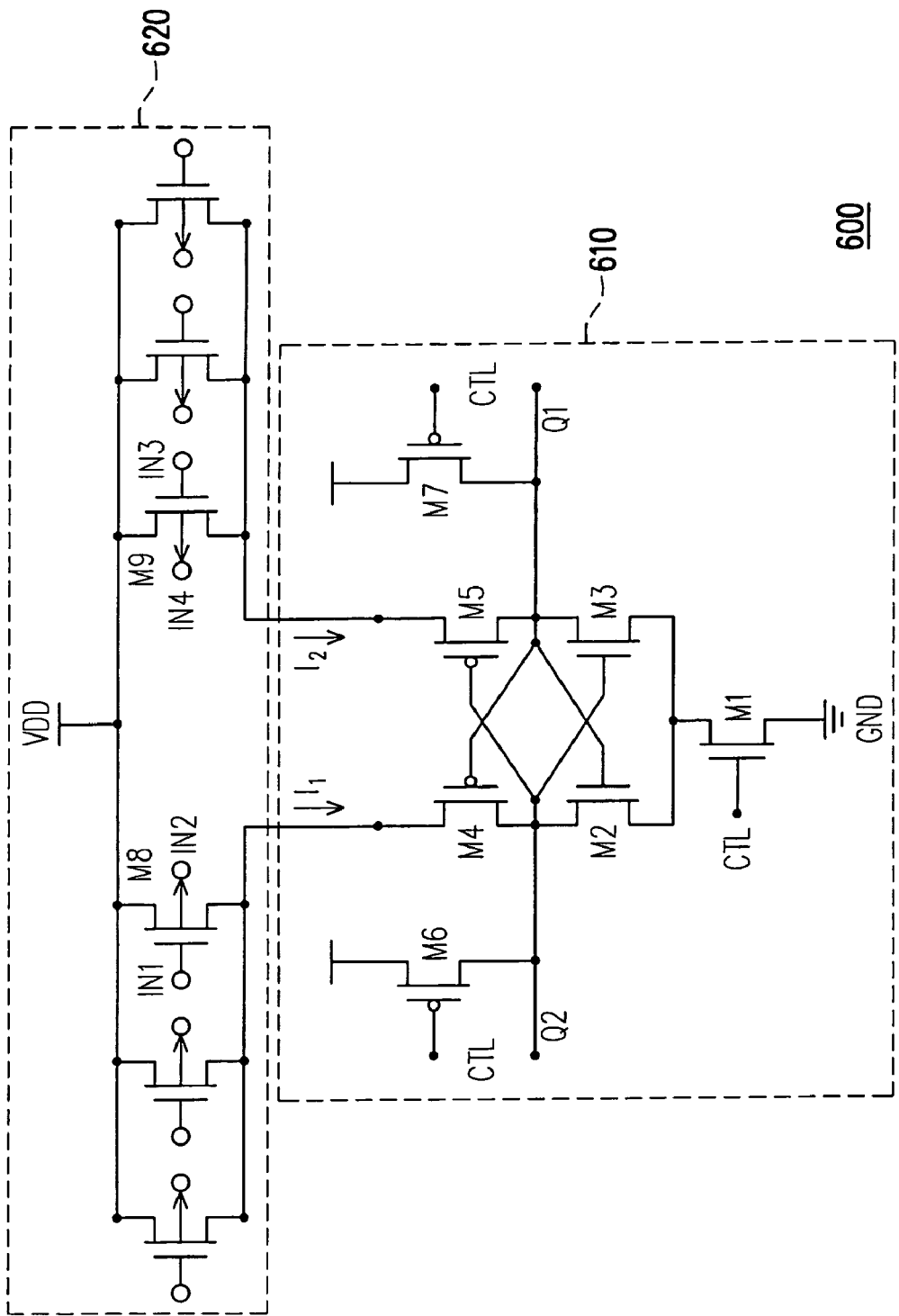
FIG. 6 is a circuit diagram illustrating a P-type bulk input current switch logic circuit according to an embodiment of the present invention.

FIG. 6 is a circuit diagram illustrating a P-type bulk input current switch logic circuit according to an embodiment of the present invention. The bulk input current switch logic circuit 600 also includes a current sense amplifier 610 and a logic tree 620. The current sense amplifier 610 includes transistors M1~M7, and the logic tree 620 includes at least a transistor M8 or at least a transistor M9. Coupling method of these transistors is similar to that of the aforementioned embodiment. A difference there between is that the first source/drain of the transistor M1 is coupled to the ground voltage GND, while the second sources/drains of the transistors M6, M7, M8 and M9 are coupled to the system voltage VDD. Moreover, besides the transistors M1~M3 are the N-type MOS, the other transistors are all the P-type MOS.

The operation method of the circuit may be described as follows. When the pre-charge enable signal CTL is enabled (which is level "0" in the present embodiment), levels of the output terminals Q1 and Q2 are respectively pulled up to the system voltage VDD, i.e. the level "1" due to turning on of the transistors M7 and M6. Next, the pre-charge enable signal CTL is transited to be disabled (which is transited to be the level "41", in the present embodiment). Now, the ground voltage GND is transmitted to the circuit via the turned on transistor M1. Meanwhile, the transistors M7 and M6 are turned off. On the other hand, the gate of the transistor M8 receives the input signal IN1, and the bulk thereof receives the input signal IN2. Since the transistor M8 is the P-type MOS, the input signal IN2 has to be greater than or equal to the input signal IN1, otherwise a current leakage path may be generated. Moreover, the transistor M8 may provide a current channel, and a current I1 may be generated due to a voltage difference of the input signals IN1 and IN2. Correspondingly, the gate of a transistor M9 receives the input signal IN3, and the bulk thereof receives the input signal IN4. Since the transistor M9 is also the P-type MOS, the input signal IN4 has to be greater than or equal to the input signal IN3, otherwise the leakage channel may be generated. Moreover, the transistor M9 may provide the current channel, and a current I2 may be generated due to a voltage difference of the input signals IN3 and IN4.

In addition, the current sense amplifier 610 is used for comparing the current I1 to the current I2. If the current I1 is greater than the current I2, the current sense amplifier 610 formed by the transistors M2~M5 may output the level "1" via the output terminal Q2, and output the level "0" via the output terminal Q1. Conversely, if the current I2 is greater than the current I1, the output terminal Q2 outputs the level "0", and the output terminal Q1 outputs the level "1".

It should be noted that regardless of the N-type bulk input current switch logic circuit 500 or the P-type bulk input current switch logic circuit 600, there is a difference between the input signals IN1 and IN2, or between the input signals IN3 and IN4. In a general logic circuit, for a logic of the input voltage, the system voltage VDD is generally considered to be the level "1", and the ground voltage GND is generally considered to be the level "0". Therefore, an boost circuit has to be included for generating a voltage higher than the system voltage VDD or a voltage lower than the ground voltage GND. To fully convey the spirit of the present invention, different types of the boost circuit are described in the following content.

Figure 7:
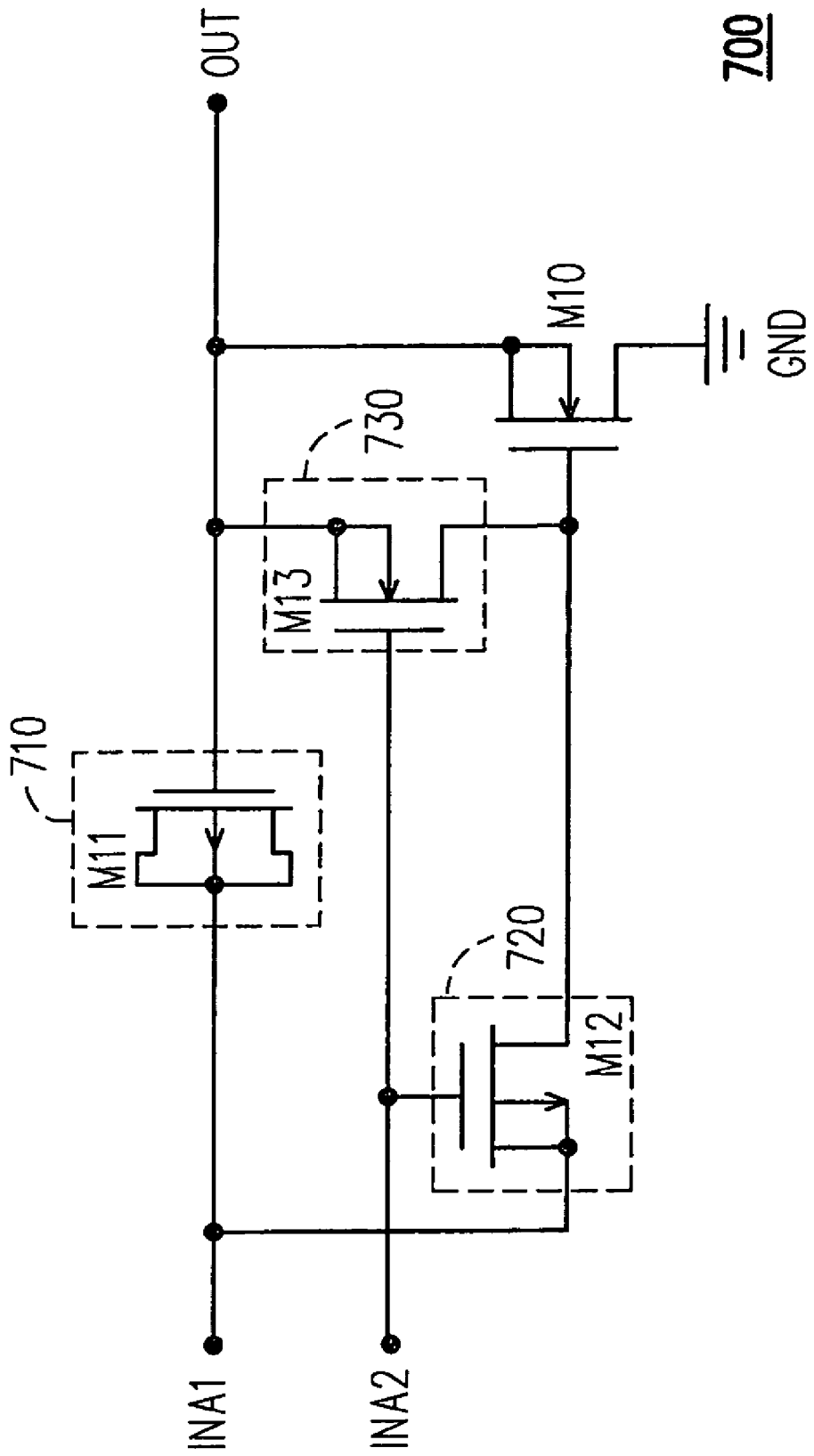
FIG. 7 and FIG. 8 are circuit diagrams respectively illustrating an boost circuit according to an embodiment of the present invention.

FIG. 7 is a circuit diagram illustrating an boost circuit according to an embodiment of the present invention. The boost circuit 700 of the present embodiment is an N-type boost circuit including a capacitor 710, switches 720 and 730 and a transistor M10. Wherein, a first terminal of the capacitor 710 is coupled to a first input terminal INA1 of the boost circuit 700. An input terminal of the switch 720 is coupled to the first input terminal INA1 of the boost circuit 700, and an enable terminal thereof is coupled to a second input terminal INA2 of the boost circuit 700. An input terminal of the switch 730 is coupled to a second terminal of the capacitor 710, an enable terminal thereof is coupled to the second input terminal INA2 of the boost circuit 700, and an output terminal thereof is coupled to an output terminal of the switch 720. Moreover, a gate of the transistor M10 is coupled to the output terminal of the switch 730, a first source/drain thereof and the second terminal of the capacitor 710 are coupled to an output terminal OUT of the boost circuit 700, and a second source/drain thereof is coupled to a third voltage. It should be noted that in the present embodiment, the capacitor 710 is formed by a transistor M11, and the switches 720 and 730 are respectively formed by transistors M12 and M13. Here, the transistors M10 and M13 are the N-type MOS, the transistors M11 and M12 are the P-type MOS, and the third voltage is the ground voltage GND.

Moreover, a first source/drain, a second source/drain and a based of the transistor M11 forming the capacitor 710 are coupled to the first/second terminal of the capacitor 710, a gate of the transistor M11 is coupled to the second/first terminal of the capacitor 710. A gate of the transistor M12 forming the switch 720 is coupled to the enable terminal of the switch 720, a first source/drain and a base thereof are coupled to the input terminal of the switch 720, and a second source/drain thereof is coupled to the output terminal of the switch 720. A gate of the transistor M13 forming the switch 730 is coupled to the enable terminal of the switch 730, a first source/drain and a base thereof are coupled to the input terminal of the switch 730, and a second source/drain thereof is coupled to the output terminal of the switch 730.

Figure 8:
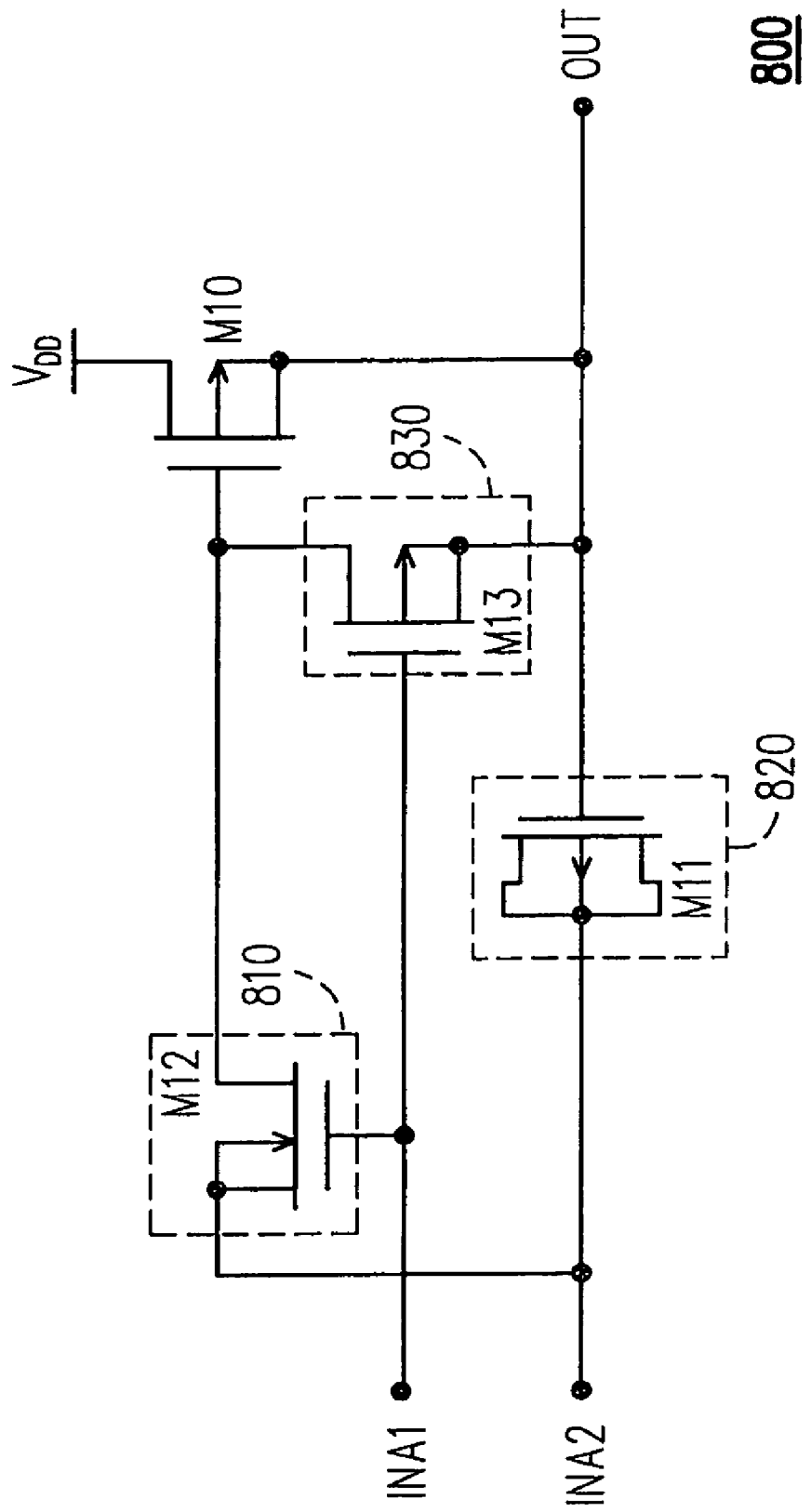

FIG. 8 is a circuit diagram illustrating an boost circuit according to another embodiment of the present invention. The boost circuit 800 of the present embodiment is a P-type boost circuit including a capacitor 820, switches 810 and 830 and a transistor M10. Differences between the boost circuit 800 and the aforementioned boost circuit 700 are that the transistors M0, M11 and M13 are all the P-type MOS, the transistor M12 is the N-type MOS, and the third voltage is coupled to the system voltage VDD. Moreover, it should be noted that regardless of the N-type boost circuit 700 or the P-type boost circuit 800, the capacitors utilized therein includes any type of transistor coupling to be the capacitor, which is not limited to be the N-type MOS shown in figures.

Figure 9B:
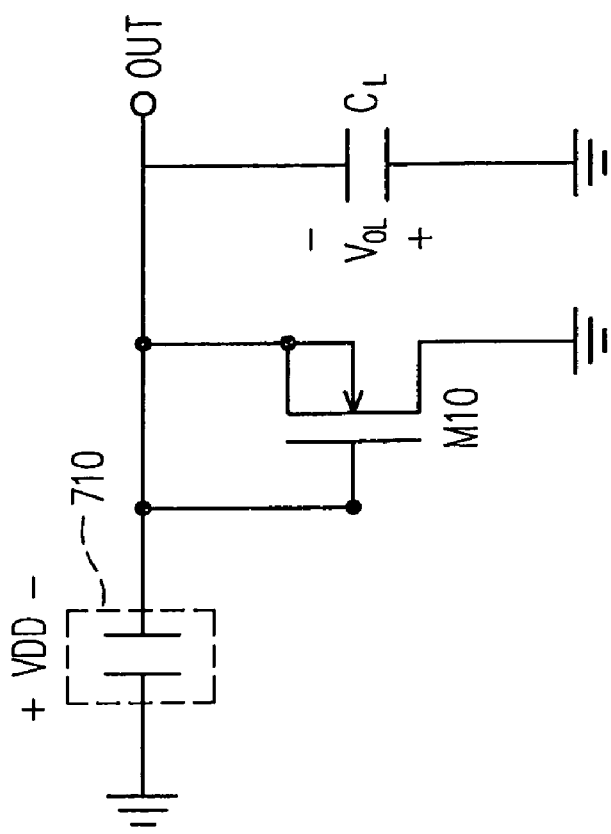
FIG. 9B is a circuit diagram illustrating an equivalent circuit of the N-type boost circuit 700 during another period.
Figure 9A:
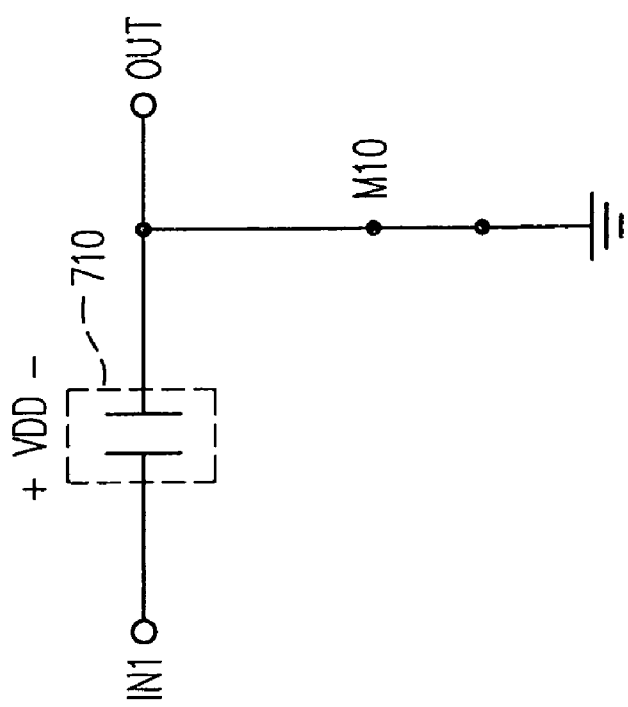
FIG. 9A is a circuit diagram illustrating an equivalent circuit of the N-type boost circuit 700 during a certain period.

As to the operation method of the boost circuit, please refer to FIG. 7 and FIG. 9A. FIG. 9A is a circuit diagram illustrating an equivalent circuit of the N-type boost circuit 700 during a certain period. Wherein, an input terminal IN1 of FIG. 9A is equivalent to the first input terminal INA1 of FIG. 7. In FIG. 7, a voltage of the first input terminal INA1 has the high level "1", and a voltage of the second input terminal INA2 is an inversion with that of the first input terminal INA1, which has the low level "0". Therefore, the switch 720 is enabled and the switch 730 is disabled. A gate of the transistor M10 is now electrically connected to the high level, and therefore the transistor M10 may be considered to be a turned on switch. The first terminal of the capacitor 710 is electrically connected to the input terminal INA1 (i.e. the high level), and the second terminal of the capacitor 710 is equivalent to being electrically connected to the ground voltage GND, and therefore the capacitor 710 is charged. In the general logic circuit, the high level is equivalent to the system voltage VDD, namely, the first terminal of the capacitor 710 is charged to the system voltage VDD, and the output terminal OUT is electrically connected to the ground voltage GND.

FIG. 9B is a circuit diagram illustrating an equivalent circuit of the N-type boost circuit 700 during another period. Now, the voltage of the first input terminal INA1 is transited to be the low level "0", and the voltage of the second input terminal INA2 is transited to be the high level "1". Now, the switch 720 is disabled, and the switch 730 is enabled. Since the voltage of the first input terminal INA1 is transited to be the low level "0", in the logic circuit, the low level "0" generally represents the ground voltage GND, i.e. 0V. Therefore, the first terminal of the capacitor 710 is momentarily coupled to the 0V, so that the second terminal of the capacitor 710 is boosted to the −VDD. The transistor M10 functions as a diode since a gate thereof is changed to electrically connected to the second terminal of the capacitor 710. Meanwhile, a parasitic capacitor $C_L$ of the output terminal OUT of the boost circuit 700 is inversely charged, so that the voltage of the output terminal OUT is $-V_{OL}$. Wherein, an absolute value of the voltage $-V_{OL}$ of the output terminal OUT is slightly less than the system voltage VDD.

Figure 9C:
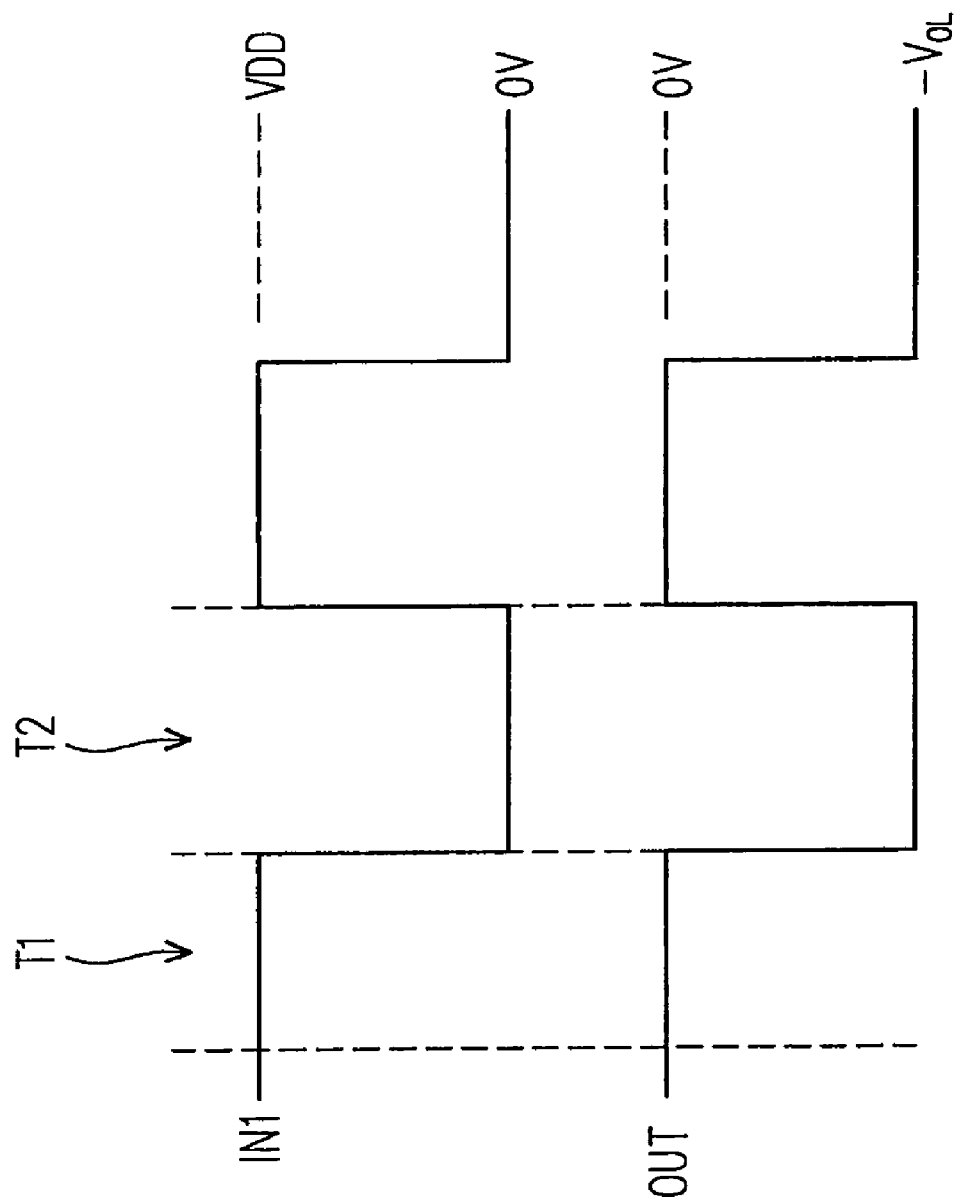
FIG. 9C is a diagram illustrating a relation between an output voltage and an input voltage of the N-type boost circuit 700.

FIG. 9C is a diagram illustrating a relation between an output voltage and an input voltage of the N-type boost circuit 700. During a period T1, the first input terminal INA1 has the system voltage VDD, and according to the above description, the output terminal OUT has the ground voltage GND (=0V). During a period T2, since the voltage of the first input terminal INA1 is transited to the ground voltage GND, the voltage of the output terminal is then boosted to $-V_{OL}$.

In the present embodiment, only the N-type boost circuit 700 is described, however, operation of the P-type boost circuit 800 is similar to that of the N-type boost circuit 700. A difference there between is that the generated voltage of the output terminal OUT is between the system voltage VDD and $V_{OH}$, wherein $V_{OH}$ is slightly less than twice of the system voltage VDD.

Figure 10A:
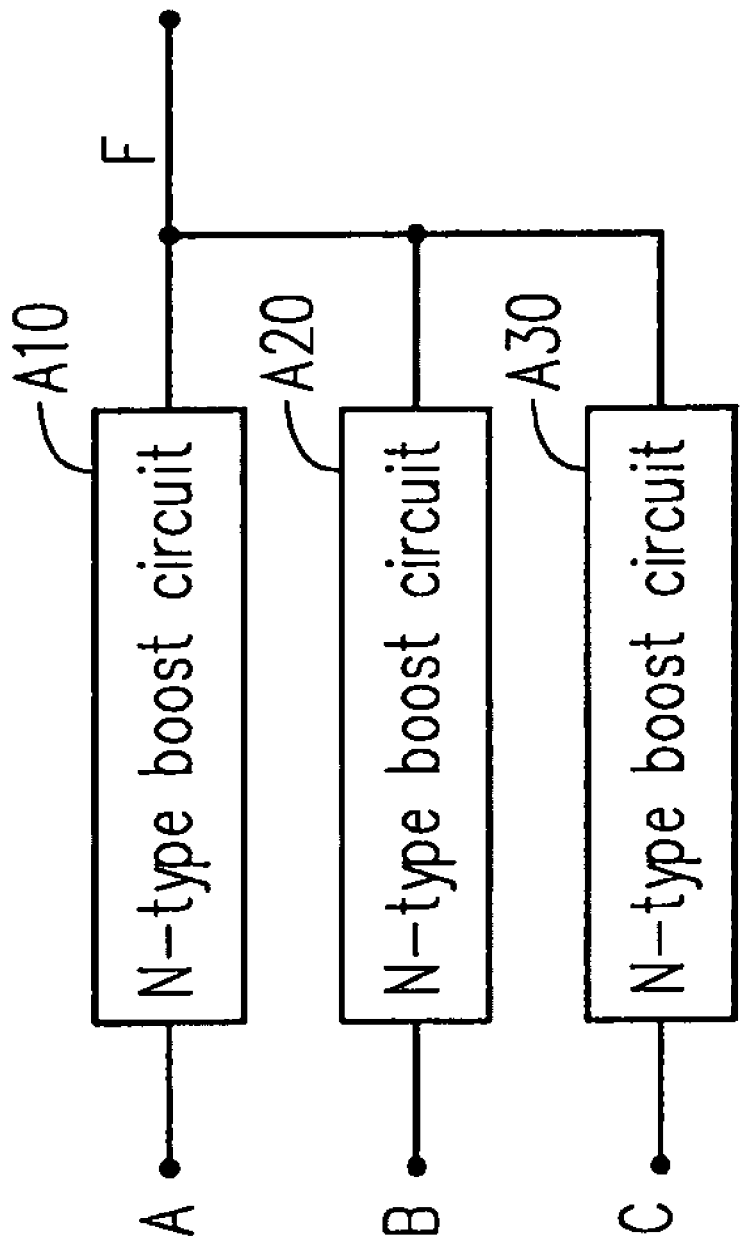
FIG. 10A is an embodiment of an OR gate circuit formed by N-type boost circuits.
Figure 10B:
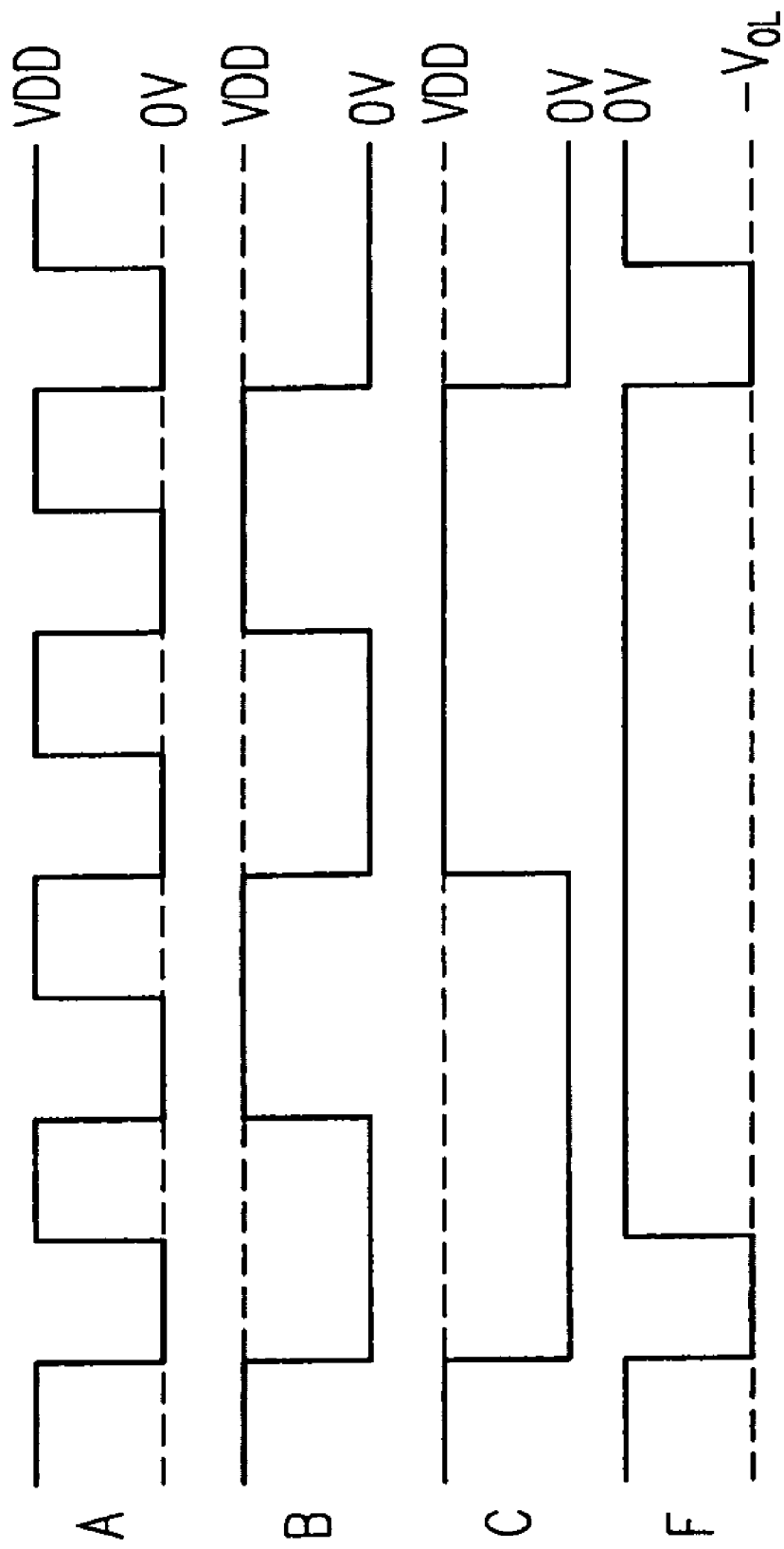
FIG. 10B is a diagram illustrating an input and output waveforms of an OR gate circuit formed by N-type boost circuits.

Moreover, a plurality of the N-type boost circuits may further form an OR gate or an NAND gate logic circuit. Referring to FIG. 10A, an embodiment of an OR gate circuit formed by N-type boost circuits is illustrated. Such OR gate circuit may be simply implemented by connecting the output terminals of a plurality of the N-type boost circuits to form a wire OR gate. Meanwhile, a problem of voltages confliction is avoided. In the present embodiment, three N-type boost circuits A10~A30 are applied for respectively receiving an input A, an input B, and an input C. Referring to FIG. 10B, FIG. 10B is a diagram illustrating an input and output waveforms of an AND gate circuit formed by N-type boost circuits.

When the inputs A, B and C are all level "0", since the three boost circuits are all inversely charged, an output F has the level $-V_{OL}$. If at least one of the inputs A, B and C has the level "1", for example, if the input A has the level "1", the output terminal of the boost circuit A10 is then pulled to the ground voltage, which is referred to as strong pull low. Such strong pull low makes the output terminals of the boost circuits A20 and A30 to be pulled together to the ground voltage GND. Therefore, the voltage level of the output F is then the ground voltage GND. In the output F, since the ground voltage GND is the relatively high level, it may be considered to be the level "1", and the $-V_{OL}$ then may be considered to be the low level "0". Moreover, if the inputs A, B and C are all inverted and input to the OR gate formed by the N-type boost circuits, a logic effect of an NAND gate then may be achieved.

Figure 11A:
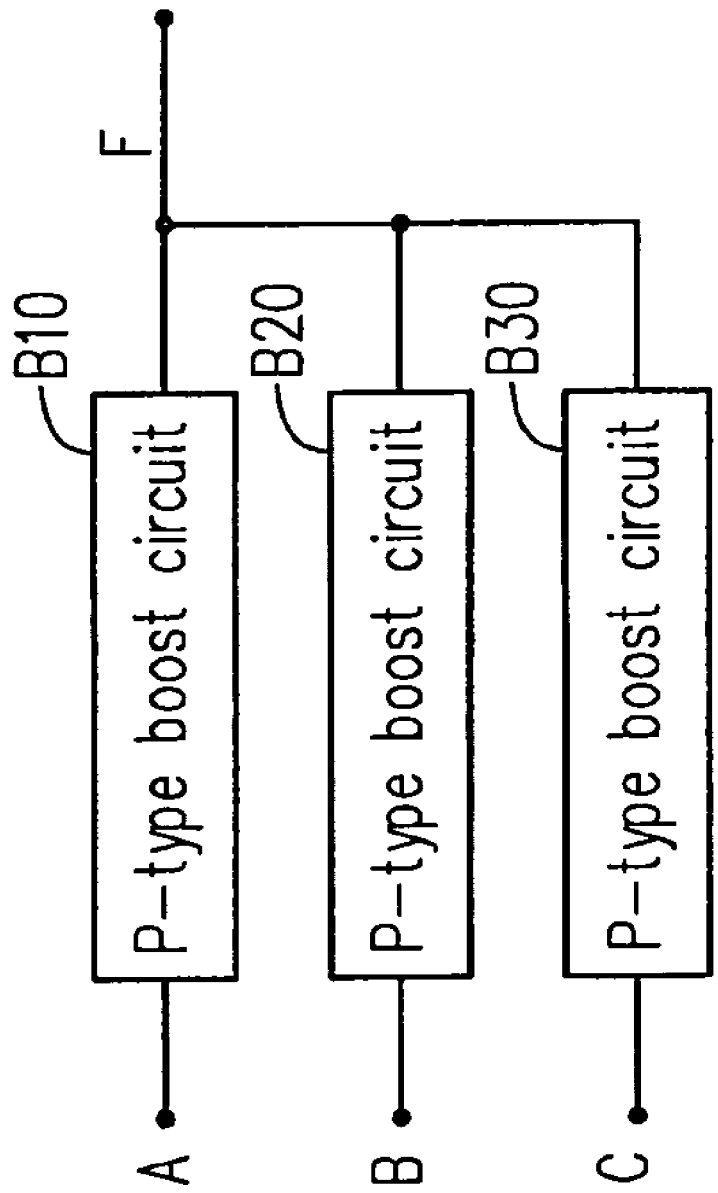
FIG. 11A is an embodiment of an AND gate circuit formed by P-type boost circuits.
Figure 11B:
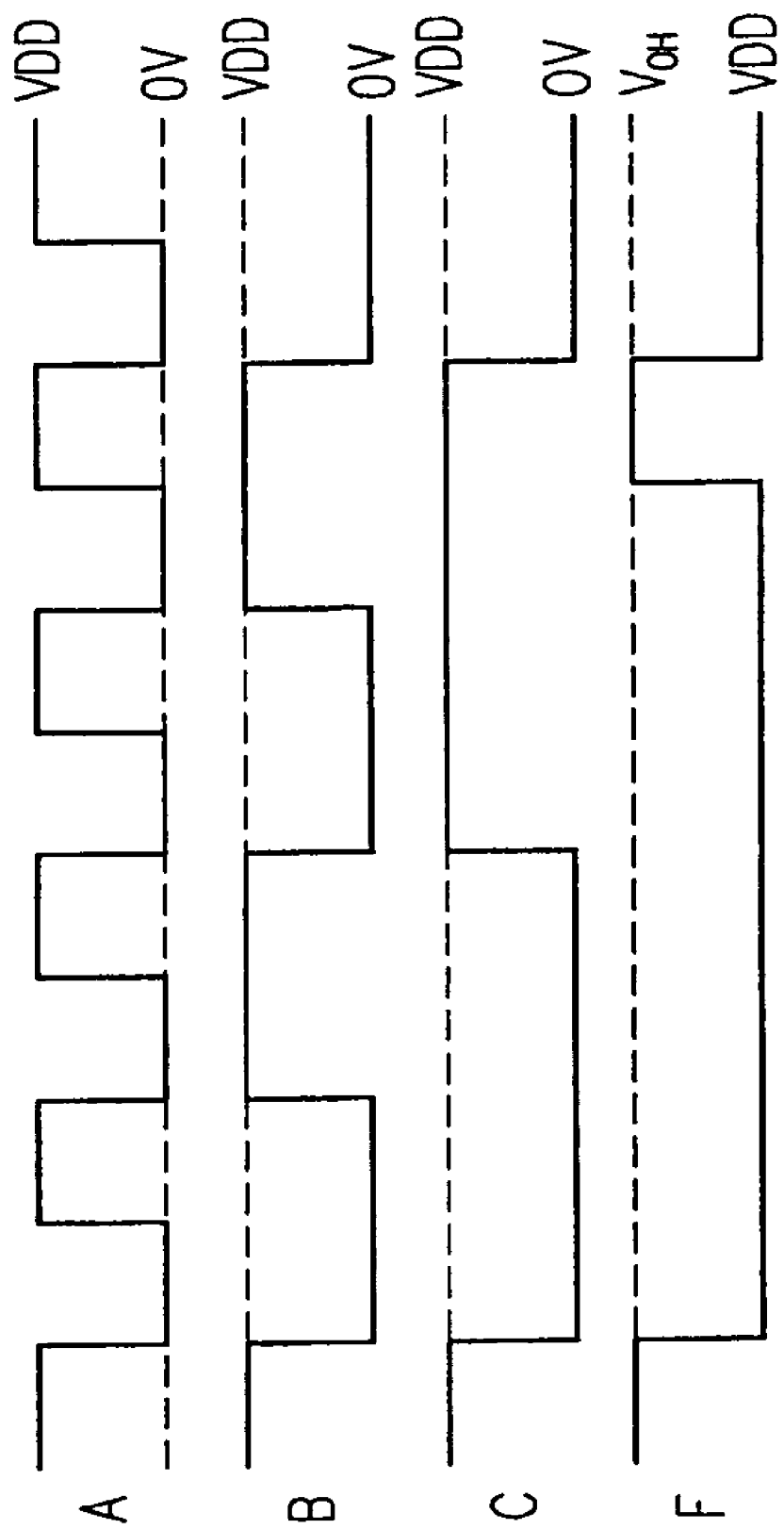
FIG. 11B is a diagram illustrating an input and output waveforms of an AND gate circuit formed by P-type boost circuits.

According to a same principle as above, an AND gate or an NOR gate logic circuit then may be easily obtained via the P-type boost circuits. Referring to FIG. 11A, an embodiment of an AND gate circuit formed by P-type boost circuits is illustrated. Such AND gate circuit may be simply implemented by connecting the output terminals of a plurality of the P-type boost circuits to form a wire AND gate. In the present embodiment, three P-type boost circuits B10~B30 are applied. Referring to FIG. 11B, FIG. 11B is a diagram illustrating an input and output waveforms of an AND gate circuit formed by P-type boost circuits. An operation method thereof is similar to that of the OR gate circuit formed by the N-type boost circuits, and therefore the detailed description thereof will not be repeated.

Here, embodiments are provided for describing the bulk input current switch logic circuit of the present invention to those skilled in the art, for a further understanding of the present invention.

Figure 12A:
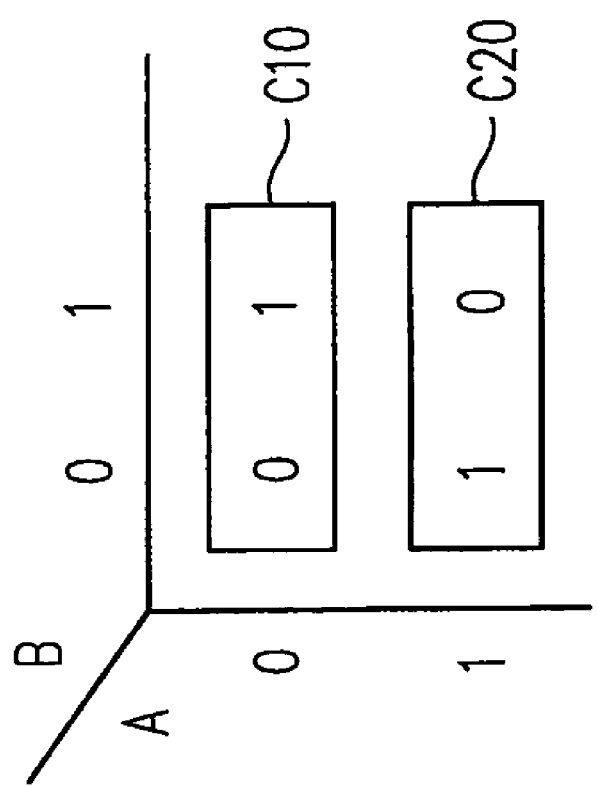
FIG. 12A is a Karnaugh map of an XOR gate.
Figure 12B:
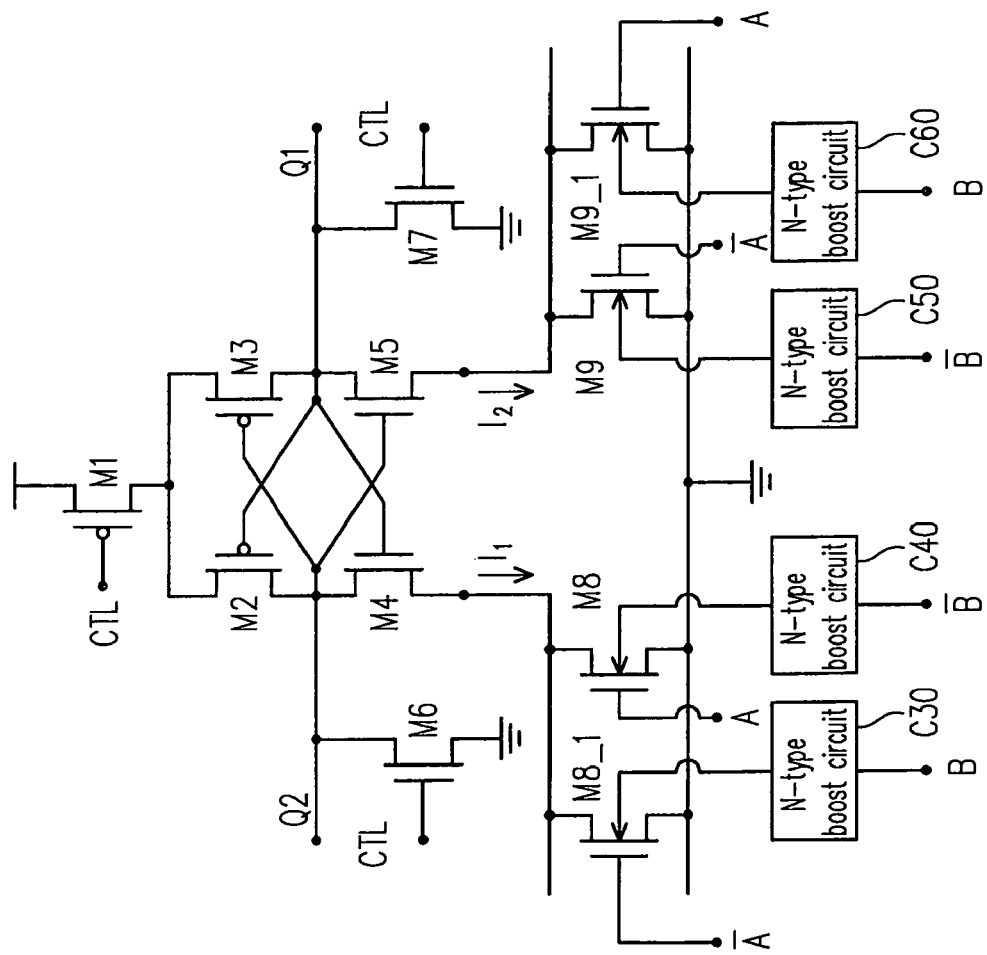
FIG. 12B is a circuit diagram illustrating an XOR gate of a bulk input current switch logic circuit according to an embodiment of the present invention.

First, an embodiment of an XOR gate designed based on the N-type bulk input current switch logic circuit and the N-type boost circuit is provided. Referring to FIG. 12A, a Karnaugh map of an XOR gate is illustrated. First, output results on the Karnaugh map which include "0" and "1" are circled for obtaining a "0 1" circle C10 and a "1 0" circle C20. Referring to FIG. 12B, a circuit diagram illustrating an XOR gate of a bulk input current switch logic circuit according to an embodiment of the present invention is illustrated. To match a requirement of the "1 0" circle C20, when input signals A and B are all level "0", a current of a transistor M8_1 has to be less than that of a transistor M9. When the input signals A and B respectively have the levels 0 1, the current of the transistor M8_1 has to be greater than that of the transistor M9. When the input signals A and B respectively have the levels 1 0, a current of a transistor M8 needs to be greater than that of a transistor M9_1. Conversely, when input signals A and B are all level "1", the current of the transistor M8 needs to be less than that of the transistor M9_1. Deduced by analogy, and in coordination with N-type boost circuits C30~C60 to shift voltage levels of input signals A, B, $\overline{A}$, $\overline{B}$, bulk inputs of the transistors M8, M9, M8_1 and M9_1 then may be accomplished, so as to implement the XOR gate of FIG. 12B.

It should be noted that since phases of output signals of output terminals Q1 and Q2 of the aforementioned embodiment are inversed, the XOR may also be an XNOR gate.

Figure 13A:
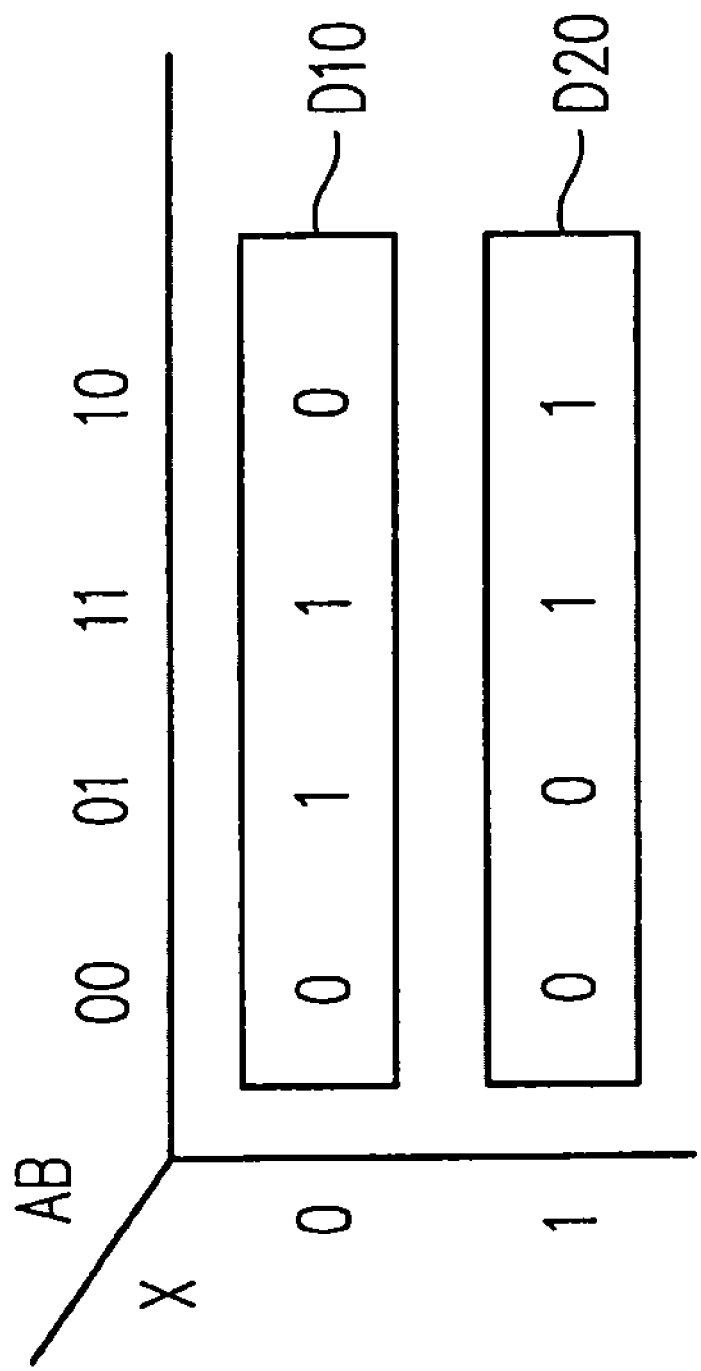
FIG. 13A is a Karnaugh map of a multiplexer.
Figure 13B:
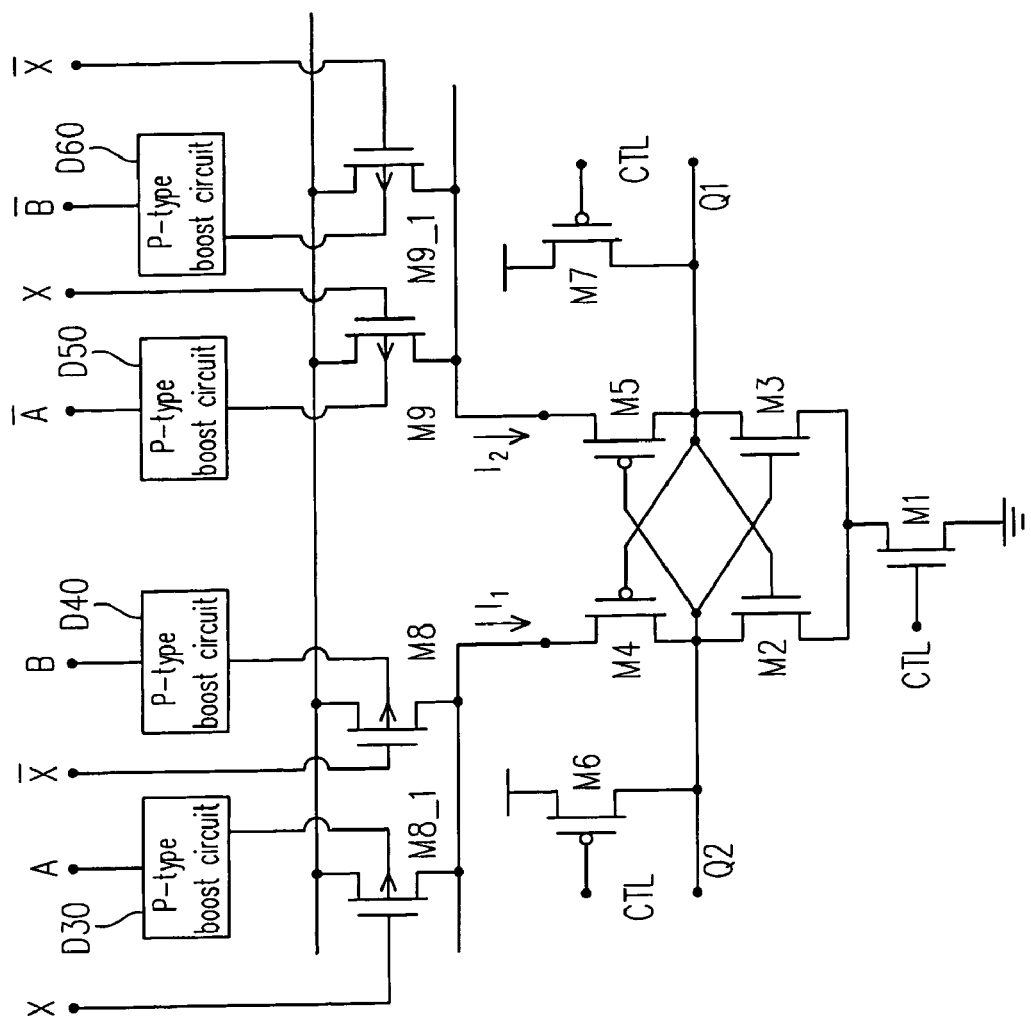
FIG. 13B is a circuit diagram illustrating a multiplexer of a bulk input current switch logic circuit according to an embodiment of the present invention.

Next, an embodiment of a multiplexer designed based on the P-type bulk input current switch logic circuit and the P-type boost circuit is provided. Referring to FIG. 13A, FIG. 13A is a Karnaugh map of a multiplexer. Referring to FIG. 13B, a circuit diagram illustrating a multiplexer of a bulk input current switch logic circuit according to an embodiment of the present invention is illustrated. Similarly, output results on the Karnaugh map which include "1 0" are circled for obtaining "1 0" circles D10~D20. To match a requirement of the "1 0", circle D10, a selection signal X of the multiplexer is input to the gates of the transistors M8_1 and M9. To match a requirement of the "1 0" circle D20, an inverted signal $\overline{X}$ of the selection signal X is input to the gates of the transistors M8 and M9_1.

Moreover, as to the bulk input, and in case the requirement of the "1 0" circle D10 is matched, when the input signal A=0 and the selection signal X=1, a discharge current of the transistor M8_1 has to be less than that of the transistor M9. When the input signal A=1 and the selection signal X=1, the discharge current of the transistor M8_1 has to be greater than that of the transistor M9. In case the requirement of the "1 0" circle D20 is matched, when the input signal A=0 and the selection signal X=0, a discharge current of the transistor M8 has to be less than that of the transistor M9_1. When the input signal A=1 and the selection signal X=0, the discharge current of the transistor M8 has to be greater than that of the transistor M9_1.

By synthesizing the requirements of the "1 0" circles D10 and D20, and by inputting the input signals A and B, and the inverted signals $\overline{A}$ and $\overline{B}$ thereof into the transistors M8, M9, M8_1 and M9_1 after the voltage levels thereof being converted by the P-type boost circuits D30~D60, the multiplexer logic circuit of FIG. 13B then may be implemented.

Figure 14:
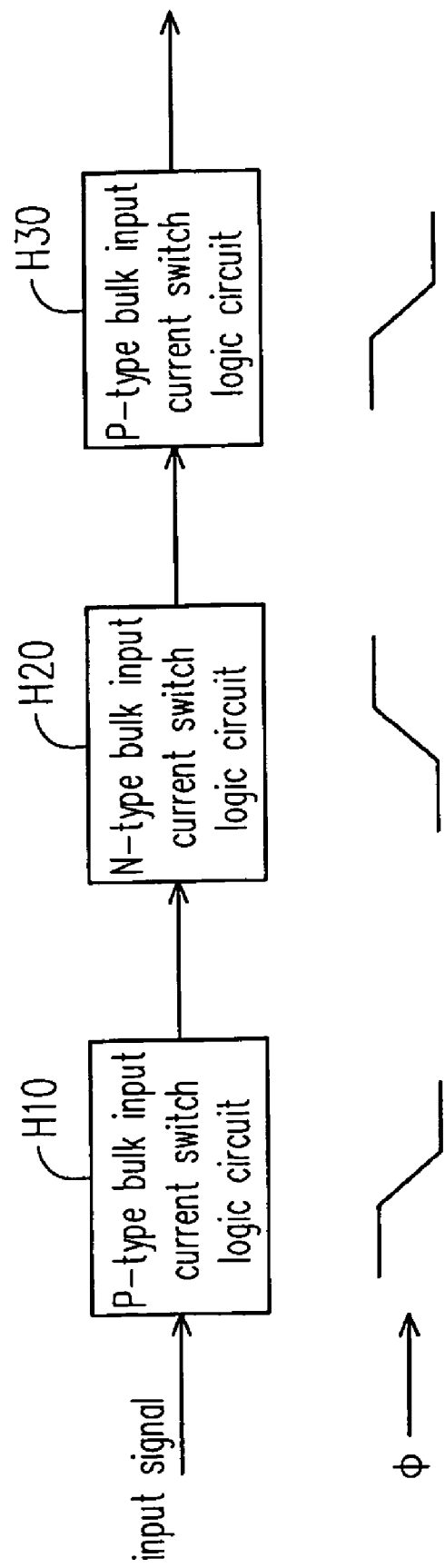
FIG. 14 is a schematic diagram of a pipeline structure according to an embodiment of the present invention.

In addition, please refer to FIG. 14 for an application of a pipeline structure, FIG. 14 is a schematic diagram of a pipeline structure according to an embodiment of the present invention. Wherein, the pipeline structure of the bulk input current switch logic circuit utilize a single phase clock (SPC) control signal. Such structure avails a design of a high speed pipeline system. Since an inverted clock signal is not applied, a problem of clock skew is avoided, so that a clock frequency thereof is improved, an output capacitance is relatively small, a buffer design is relatively easy, and clock distribution structure considerations are reduced and a layout size of the circuit is reduced. A working principle thereof is as follows. When a clock signal ϕ is changed from 0 to 1, an internal current sense amplifier of a P-type bulk input current switch logic circuit H10 start to operate, and a full-swing output is performed via the output terminals Q1 and Q2 for transmitting to a next stage N-type bulk input current switch logic circuit H20. When the clock signal ϕ is changed from 1 to 0, an internal current sense amplifier of a N-type bulk input current switch logic circuit H20 start to operate, and a full-swing output is performed via the output terminals Q1 and Q2 for transmitting to a third stage P-type bulk input current switch logic circuit H30, and so on, until operation the whole pipeline structure is completed.

In summary, in the present invention, by sensing current, switch of levels transition may be quickly accomplished, and by applying only two serially connected transistors, transmission speed of digital signals may be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A current switch logic circuit, comprising:
    a current sense amplifier, comprising:
        a first transistor, having a gate, a first source/drain and a second source/drain, wherein the first source/drain is coupled to a first voltage, the gate is coupled to a pre-charge enable signal;
        a second transistor, having a gate, a first source/drain and a second source/drain, wherein the first source/drain is coupled to the second source/drain of the first transistor, the gate is coupled to a first output terminal, and the second source/drain is coupled to a second output terminal;
        a third transistor, having a gate, a first source/drain and a second source/drain, wherein the first source/drain is coupled to the second source/drain of the first transistor, the gate is coupled to the second output terminal, and the second source/drain is coupled to the first output terminal;
        a fourth transistor, having a gate, a first source/drain and a second source/drain, wherein the first source/drain is coupled to the second output terminal, the gate is coupled to the first output terminal; and
        a fifth transistor, having a gate, a first source/drain and a second source/drain, wherein the first source/drain is coupled to the first output terminal, and the gate is coupled to the second output terminal; and
    a logic tree, coupled to the current sense amplifier, for generating a first current according to a first input signal and a second input signal, and generating a second current according to a third input signal and a fourth input signal.

2. The current switch logic circuit as claimed in claim 1, wherein the current sense amplifier respectively generates a first output signal at the first output terminal and a second output signal at the second output terminal according to the first current and the second current.

3. The current switch logic circuit as claimed in claim 1, wherein the logic tree comprises:
    at least a sixth transistor, having a gate, a first source/drain, a second source/drain, and a base, wherein the first source/drain is coupled to the second source/drain of the fourth transistor, the gate is used for receiving the first input signal, the base is used for receiving the second input signal, and the second source/drain is coupled to the second voltage; and
    at least a seventh transistor, having a gate, a first source/drain, a second source/drain and a base, wherein the first source/drain is coupled to the second source/drain of the fifth transistor, the gate is used for receiving the third input signal, the base is used for receiving at least the fourth input signal, and the second source/drain is coupled to the second voltage.

4. The current switch logic circuit as claimed in claim 1, wherein the current sense amplifier further comprises:
    an eighth transistor, having a gate, a first source/drain and a second source/drain, wherein the first source/drain is coupled to the second output terminal, the gate is used for receiving the pre-charge enable signal, and the second source/drain is coupled to the second voltage; and
    a ninth transistor, having a gate, a first source/drain and a second source/drain, wherein the first source/drain is coupled to the first output terminal, the gate is used for receiving the pre-charge enable signal, and the second source/drain is coupled to the second voltage.

5. The current switch logic circuit as claimed in claim 3, wherein when a number of the sixth transistor or the seventh transistor is more than one, the sixth transistors or the seventh transistors are respectively coupled with each other in parallel.

6. The current switch logic circuit as claimed in claim 4, wherein the eighth transistor and the ninth transistor are turned on when the pre-charge enable signal is enabled, so that the second output terminal and the first output terminal are all pre-charged to the second voltage.

7. The current switch logic circuit as claimed in claim 1, wherein when the pre-charge enable signal is disabled, the current sense amplifier compares the first current to the second current and generates the first output voltage and the second output voltage, wherein voltage levels of the first output voltage and the second output voltage are inversed.

8. The current switch logic circuit as claimed in claim 3, wherein the first transistor, the second transistor and the third transistor are P-type transistors, and the fourth transistor, the fifth transistor, the sixth transistor and the seventh transistor are N-type transistors, the first voltage is a system voltage, and the second voltage is a ground voltage.

9. The current switch logic circuit as claimed in claim 1, wherein the first transistor, the second transistor and the third transistor are N-type transistors, and the fourth transistor, the fifth transistor, the sixth transistor and the seventh transistor are P-type transistors, the first voltage is a ground voltage, and the second voltage is a system voltage.

10. The current switch logic circuit as claimed in claim 1 further comprising at least an boost circuit having a first input terminal, a second input terminal and an output terminal, wherein the first input terminal is used for receiving a fifth input signal, the second input terminal is used for receiving a sixth input signal, the fifth input signal and the sixth input signal are inversed, and the output terminal outputs the second input signal or the fourth input signal, wherein the boost circuit comprises:
    a capacitor, having a first terminal and a second terminal, wherein the first terminal is coupled to the first input terminal of the boost circuit;
    a first switch, having an input terminal, an output terminal and an enable terminal, wherein the input terminal is coupled to the first input terminal of the boost circuit, and the enable terminal is coupled to the second input terminal of the boost circuit;

a second switch, having an input terminal, an output terminal and an enable terminal, wherein the input terminal is coupled to the second terminal of the capacitor, the enable terminal is coupled to the second input terminal of the boost circuit, and the output terminal is coupled to the output terminal of the first switch; and a tenth transistor, having a gate, a first source/drain and a second source/drain, wherein the gate is coupled to the output terminal of the second switch, the first source/drain and the second terminal of the capacitor are coupled to the output terminal of the boost circuit, and the second source/drain is coupled to a third voltage, wherein the boost circuit enables/disables the first switch and the second switch according to the sixth signal, and boost the fifth signal via the capacitor to generate the second input signal or the fourth input signal.

11. The current switch logic circuit as claimed in claim 10, wherein the capacitor comprises:

an eleventh transistor, having a gate, a first source/drain, a second source/drain and a base, wherein the first source/drain, the second source/drain and the base is coupled to the first/second terminal of the capacitor, and the gate is coupled to the second/first terminal of the capacitor.

12. The current switch logic circuit as claimed in claim 10, wherein the first switch comprises:

a twelfth transistor, having a gate, a first source/drain, a second source/drain and a base, wherein the gate is coupled to the enable terminal of the first switch, the first source/drain and the base are coupled to the input terminal of the first switch, and the second source/drain is coupled to the output terminal of the first switch.

13. The current switch logic circuit as claimed in claim 10, wherein the second switch comprises:

a thirteenth transistor, having a gate, a first source/drain, a second source/drain and a base, wherein the gate is coupled to the enable terminal of the second switch, the first source/drain and the base are coupled to the input terminal of the second switch, and the second source/drain is coupled to the output terminal of the second switch.

14. The current switch logic circuit as claimed in claim 10, wherein the tenth transistor and the thirteenth transistor are the N-type transistors, the twelfth transistor is the P-type transistor, and the third voltage is the ground voltage.

15. The current switch logic circuit as claimed in claim 10, wherein the tenth transistor and the thirteenth transistor are the P-type transistors, the twelfth transistor is the N-type transistor, and the third voltage is the system voltage.

* * * * *